United States Patent [19]

Harford

[11] 4,218,708
[45] Aug. 19, 1980

[54] KEYED AGC CIRCUIT

[75] Inventor: Jack R. Harford, Flemington, N.J.

[73] Assignee: RCA Corporation, New York, N.Y.

[21] Appl. No.: 934,823

[22] Filed: Aug. 18, 1978

[51] Int. Cl.² .............................................. H04N 5/52
[52] U.S. Cl. ................................................ 358/178
[58] Field of Search ............... 358/178, 177, 167, 174, 358/176

[56] References Cited

U.S. PATENT DOCUMENTS

| 3,449,513 | 6/1969 | Jachim | 358/178 |
| 3,531,590 | 9/1970 | Jachim | 358/178 |
| 3,624,290 | 11/1971 | Hofmann | 358/167 |
| 3,740,471 | 6/1973 | Wilcox | 358/178 |
| 3,835,248 | 9/1974 | Harford | 358/177 |

*Primary Examiner*—Richard Murray
*Attorney, Agent, or Firm*—Eugene M. Whitacre; Paul J. Rasmussen; W. Brinton Yorks, Jr.

[57] ABSTRACT

A keyed AGC circuit is responsive to the peak level of synchronizing signal components of a composite video signal for generating an AGC control voltage in a television receiver. A peak detector samples the peaks of the synchronizing signal components during keying intervals. Signal translating means are keyed by an AGC keying signal to provide charging and discharging currents for an AGC filter capacitor which are each a function of the signal level stored by the peak detector. A discharge circuit is responsive to the absence of the AGC keying signal to continuously discharge the peak detector during video scanning intervals to prevent the retention of charge by the peak detector resulting from noise or video signal information.

11 Claims, 1 Drawing Figure

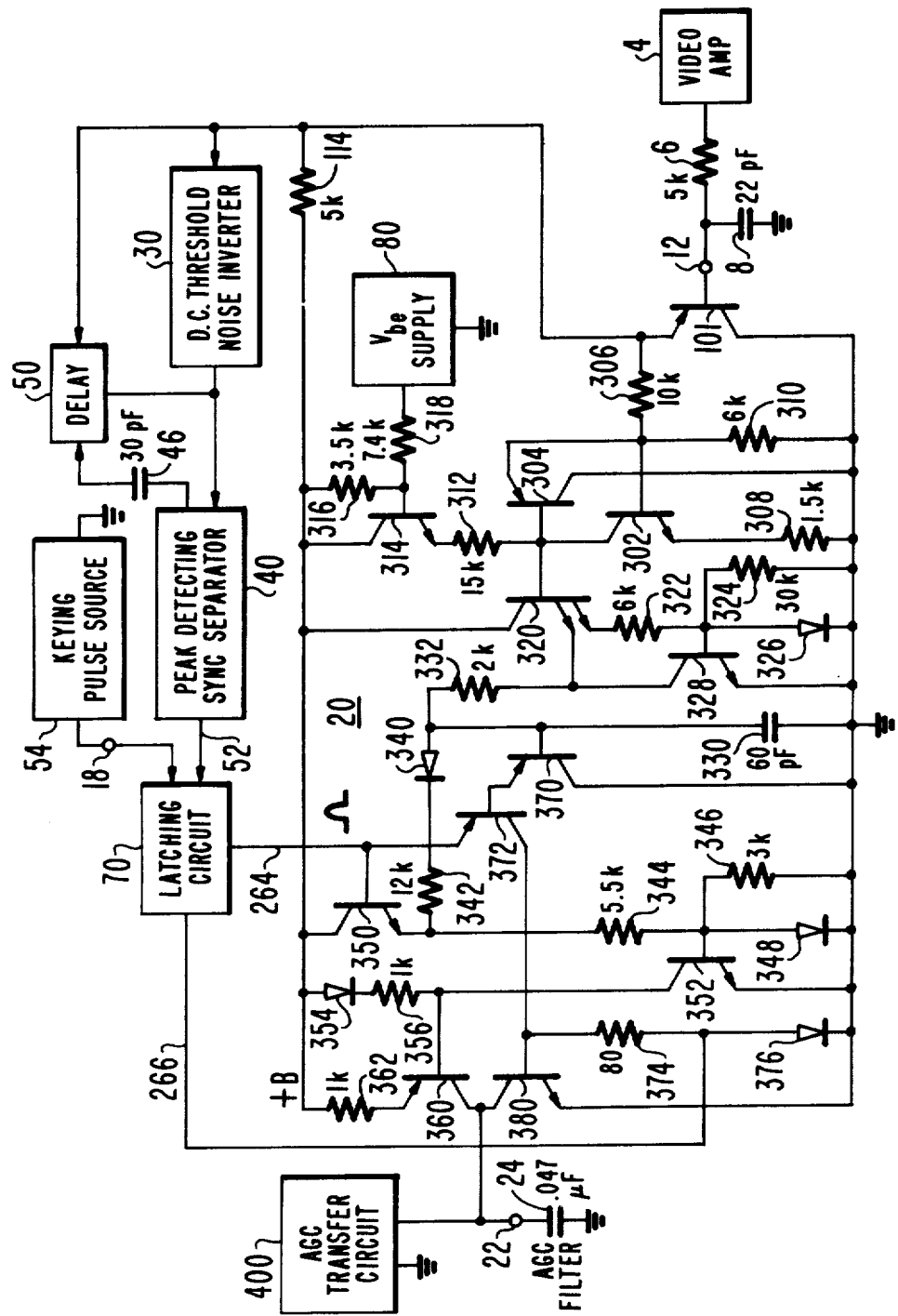

KEYED AGC CIRCUIT

This invention relates to a keyed AGC circuit including a peak detecting sample and hold circuit and signal translating circuit for developing an AGC control voltage in a television receiver.

AGC circuits are commonly used in television receivers to derive a suitable control voltage for application to the radio frequency (RF) and intermediate (IF) amplifier stages of the receiver. The control voltage is effective to vary the gain of these stages inversely in accordance with the level of the synchronizing pulse components of a detected video signal so as to provide a constant peak amplitude of the detected television signal.

It is customary in television receivers to derive the AGC control voltage by sampling the peak level of the synchronizing pulse components of the composite video signal and adjusting the control voltage in response to changes in the signal level. A peak detector may be utilized to sample the sync pulses, but because it is quite susceptible to impulse noise, means are generally provided to gate "on", or key, the AGC circuit only during the relatively short horizontal retrace (flyback) pulses produced by the horizontal deflection system. In this way, amplitude variations of the video signal during the remainder of the line scanning period cannot affect the operation of the AGC circuit.

However, even if an AGC control voltage is adjusted only during keyed intervals, it is nonetheless possible for the peak detector to retain some residual voltage level at the beginning of a keying interval as a result of impulse noise which occurred in the video signal during the line scanning period. This residual charge will cause the peak detector to be charged, or "set-up", to an incorrect signal level during the keying interval, thereby generating an incorrect AGC control voltage. Circuits of the prior art have included complex noise protection arrangements to prevent this impulse noise set-up. Prior art circuits have also been designed to discharge the peak detector, but have resulted in undesirable variations in the AGC control voltage.

In accordance with the principles of the present invention, a keyed AGC circuit is provided which is responsive to the peak level of synchronizing signal components of a composite video signal for generating an AGC control voltage in a television receiver. A peak detector samples the peaks of the synchronizing signal components. Means are provided for charging the peak detector to the peaks of the synchronizing signal components, including means for reducing the impedance of the charging means as the peak detector is charged. Signal translating means are keyed by an AGC keying signal to provide charging and discharging currents for an AGC filter capacitor which are each a function of the charge stored by the peak detector. Discharging means are responsive to the absence of the AGC keying signal to discharge the peak detector during video scanning intervals to prevent the retention of charge by the peak detector resulting from noise or video signal information. The retention of this charge by the peak detector could cause the AGC circuit to generate an incorrect AGC control voltage during the succeeding keying interval.

In an illustrative embodiment of the present invention, the discharging means comprises a diode and a resistive network serially coupled across a peak detecting capacitor. When the AGC circuit is not being keyed by the AGC keying signal, the diode and resistive network provide a discharge path for the peak detecting capacitor. During keying intervals, the diode is reverse-biased to allow the peak detecting capacitor to charge to the peak level of the synchronizing signal components of the composite video signal. The signal level stored on the peak detecting capacitor is translated through two signal paths to the base electrodes of current source and current sink transistors during the keying interval. The current source and sink transistors have high impedance collector electrodes coupled to an AGC filter capacitor to charge the capacitor to a level related to the signal level stored on the peak detecting capacitor. When the AGC filter capacitor has been charged to the proper signal level, the current conducted by the current source transistor is equal to that conducted by the current sink transistor. These equilibrium currents have the same value, independent of the signal level stored on the AGC filter capacitor.

In the sole FIGURE, an AGC circuit constructed in accordance with the principles of the present invention is illustrated partially in schematic diagram form and partially in block diagram form.

Referring to the FIGURE, a video amplifier 4 is shown which provides a composite video signal to an input terminal 12 by way of a low pass filter comprising a series resistor 6 and a shunt capacitor 8. The composite video signal at terminal 12 is coupled to the base of a transistor 101, which has its collector electrode coupled to a source of reference potential (ground). The composite video signal is coupled to an active filter delay 50, a D.C. threshold noise inverter 30, and an AGC circuit 20 from the emitter of transistor 101. Supply voltage for transistor 101 is provided by a resistor 114, which is coupled from the emitter of transistor 101 to a source of supply voltage (+B).

The D.C. threshold noise inverter produces inverted noise pulses in response to impulse noise in the composite video signal which exceeds a D.C. threshold. The inverted noise pulses are combined with the composite video signal which has been delayed by active filter delay 50, resulting in the cancellation of impulse noise in the composite video signal. The noise-free video signal is coupled to a peak detecting sync separator 40 for the generation of a sync signal. A feedback capacitor 46 couples the video signal at the input of the sync separator 40 to the active filter delay 50 to improve the risetime of the synchronizing signal components of the composite video signal. The active filter delay 50 and the D.C. threshold noise inverter 30 are described more fully in my copending United States patent application, Ser. No. 934,829, entitled "NOISE CANCELLATION CIRCUIT," filed concurrently herewith. The peak detecting sync separator 40 is described in further detail in my copending Unites States patent application, Ser. No. 934,821, entitled "SYNCHRONIZATION SIGNAL SEPARATOR CIRCUIT," filed concurrently herewith, now U.S. Pat. No. 4,185,299.

The sync signals produced by the sync separator 40 are coupled to a latching circuit 70. The latching circuit 70 also receives horizontal retrace pulses from a keying pulse source 54 which are derived, for example, from a transformer in the horizontal deflection system (not shown). The horizontal retrace pulses are normally in coincidence with the sync signals and are combined by the latching circuit 70 to generate a keying signal for AGC circuit 20 on a conductor 264. When the horizontal retrace pulses are not in coincidence with the sync signals, a second keying signal is coupled to AGC circuit 20 by a conductor 266 in response to the horizontal retrace pulses. The latching circuit 70 is described more fully in my copending United States patent application, Ser. No. 934,835, entitled "AGC KEYING SIGNAL CIRCUIT," filed concurrently herewith.

The video signal developed at the emitter of transistor 101 is coupled by a resistor 306 to an input amplifier including transistors 302 and 304. The emitter electrode of transistor 302 is coupled to ground by a resistor 308 and its collector electrode is coupled to the base of transistor 304. The collector of transistor 304 is coupled to ground and the emitter of transistor 304 is coupled to the base of transistor 302 and to ground by a resistor 310. Collector voltage for transistor 302 is provided by a transistor 314, which has its collector electrode coupled to the +B supply and its emitter electrode coupled to the collector of transistor 302 by a resistor 312. Bias current for transistor 314 is provided by a resistor 316, which is coupled between the base of transistor 314 and the +B supply, and a resistor 318, which is coupled from the base of transistor 314 to a $V_{be}$ supply 80. The $V_{be}$ supply 80 is described more fully in my previously referenced United States patent application Ser. No. 934,829, entitled "NOISE CANCELLATION CIRCUIT."

An inverted video signal is coupled from the collector of transistor 302 to the base of a transistor 320, which is a dual-emitter transistor connected in an emitter-follower configuration. The collector of transistor 320 is coupled to the +B supply, while one emitter electrode is coupled to the collector of a transistor 328 and the other emitter electrode is coupled to the base of a transistor 328 by a resistor 322. Transistor 328 has its emitter electrode coupled to ground and its base electrode coupled to ground by a forward biased diode 326 and a resistor 324.

The junction between the first emitter of transistor 320 and the collector of transistor 328 is coupled to a peak detector capacitor 330 by a resistor 332. Capacitor 330 is coupled between resistor 332 and ground. Also coupled to the junction of resistor 332 and capacitor 330 is the base of a sampling transistor 370 and the anode of a diode 340. Diode 340 provides a controllable discharge path for capacitor 330 by the series coupling from its cathode electrode of resistors 342, 344, and 346 to ground. Sampling transistor 370 has its collector electrode coupled to ground and its emitter electrode coupled to the base of a transistor 372.

The keying pulse on conductor 264 from the latching circuit 70 is coupled to the base electrode of a switching transistor 350 to key the AGC circuit into operation. Transistor 350 has its collector electrode coupled to the +B supply and its emitter electrode coupled to the junction of resistors 342 and 344. The junction of resistors 344 and 346 is coupled to a current mirror at the base electrode of a transistor 352 and the anode electrode of a diode 348. The cathode of diode 348 and the emitter electrode of transistor 352 are coupled to ground. The collector electrode of transistor 352 is coupled to the junction of a resistor 356 and the base of a transistor 360. Resistor 356 is coupled to the cathode of a diode 354, which has its anode electrode coupled to the +B supply.

PNP transistor 360 provides a current source for an AGC filter capacitor 24, and has its emitter electrode coupled to the +B supply by a resistor 362 and its collector electrode coupled to the AGC filter capacitor at terminal 22. Terminal 22 is also coupled to an AGC transfer circuit 400 which couples AGC control voltage to the IF and RF amplifying stages in the television receiver (not shown). The keying pulse from conductor 264 is also coupled to the emitter of a transistor 372, which has its collector electrode coupled to the junction of resistor 374 and the base of transistor 380. Resistor 374 is coupled to the anode of a diode 376 and conductor 266. The cathode of diode 376 is coupled to ground.

NPN transistor 380 provides a current sink for AGC filter capacitor 24 and the current supplied by current source transistor 360. Transistor 380 has its emitter electrode coupled to ground and its collector electrode coupled to the AGC filter capacitor and the collector of transistor 360 at terminal 22.

In operation, a negative-going video signal including a synchronizing signal component is coupled to the base of input transistor 302 by transistor 101 through resistor 306. The video signal is inverted by transistor 302 and appears at the base of transistor 320 as a positive-going signal. A weak video signal or normal video signal containing primarily white level video information will cause transistor 302 to saturate. As transistor 302 saturates and the voltage on its collector electrode drops to the voltage level of its emitter electrode, base current will be injected into the collector of the transistor and its collector voltage will begin to rise. This oversaturation condition would result in the detection of an incorrect signal level on peak detector capacitor 330. This undesirable operation condition is prevented by transistor 304, which acts to conduct excess current away from the collector of transistor 302 through its base-collector path to ground after transistor 302 has reached its saturation level.

Transistor 314 limits the maximum voltage of the inverted (i.e., positive-going) video signal at the base of transistor 320 to 8 volts. This voltage clamp ensures that the voltage breakdown of peak detector capacitor 330 of 8 volts is not exceeded.

The positive video signal at the base of transistor 320 causes that transistor to conduct current through resistor 332 to charge peak detector capacitor 330 to the amplitude of the sync signal components of the video signal. The maximum amplitude of the sync tips will be stored on capacitor 330. The keying pulse applied to the base of transistor 350 will turn on transistor 350 to reverse bias diode 340 for the duration of the keying pulse. This prevents discharge of capacitor 330 through diode 340 and resistors 342, 344, and 346 during the keying pulse interval.

It was found that as capacitor 330 charges to the voltage level of the video signal at the base of transistor 320, the emitter impedance of transistor 320 increases. The increasing impedance decreases the exponential rate at which capacitor 330 is charged and results in the charging of capacitor 330 to a value below the sync tip for short sync pulses, such as the equalizing pulses. The voltage level stored on capacitor 330 thus becomes a function of sync pulse duration and amplitude, instead of only pulse amplitude. This problem is overcome in the present invention by the operation of transistor 328, which is controlled by the second emitter of transistor 320. As transistor 320 conducts current through its two emitter electrodes, transistor 328 will be driven into conduction by current from the second emitter of transistor 320. Transistor 328 conducts a portion of the current from the first emitter of transistor 320 through its collector to emitter path, which is sufficient to clamp the impedance at the first emitter of transistor 320 at a level which is substantially less than the impedance of resistor 332. The low emitter impedance of transistor 320 allows capacitor 330 to charge to the maximum sync tip level. This feature of the peak detector is described in further detail in a copending United States patent application of Edward C. Fox, Ser. No. 934,834, entitled, "PEAK DETECTOR CIRCUIT," filed concurrently herewith.

As mentioned previously, the keying pulse from the latching circuit 70 will cause transistor 350 to turn on, reverse-biasing diode 340. Transistor 350 also conducts current to the base of transistor 352, turning that transistor on. The level of the rectified keying signal at the emitter of transistor 350 is determined in part by the voltage level of capacitor 330, as this level is translated up 2 $V_{be}$'s (1.2 volts) by the base to emitter junctions of transistors 370 and 372, and down one $V_{be}$ by the base to emitter junction of transistor 350. The current conducted to the base of transistor 352 is thus a function of the sync tip level voltage stored on capacitor 330.

The conduction of transistor 352 causes transistor 360 to conduct, thereby supplying charging current to the AGC filter capacitor 24. Some or all of the charging current conducted by transistor 360 will be conducted away from the AGC filter capacitor by current sink transistor 380, as discussed below.

The keying pulse supplied by the latching circuit 70 also provides a source of emitter current for transistor 372. The base of transistor 372 is coupled to the emitter of transistor 370 which provides a signal determined by the voltage level stored on peak detector capacitor 330. Transistor 370 is coupled between capacitor 330 and the base of transistor 372 because transistor 372 is a low beta transistor which requires a relatively large base current. Transistor 370 is a high beta transistor requiring a relatively small base current which does not adversely affect the charge stored on capacitor 330.

The current flow through the emitter to collector path of transistor 372 is coupled to the base of current sink transistor 380, causing this transistor to conduct. Current sink transistor 380 acts to discharge the AGC filter capacitor 24 toward ground under weak signal conditions when the gain of the receiver is to be increased. Under these signal conditions, current source transistor 360 supplies less charging current than is conducted by current sink transistor 380, resulting in a net discharge of AGC filter capacitor 24. Under strong signal conditions, current source transistor 360 supplies more current than current sink transistor 380 conducts, resulting in a net charging of AGC filter capacitor 24. When the sync tip of the video signal is at the proper voltage level and no AGC gain correction is required, the current supplied by current source transistor 360 precisely matches the current conducted by current sink transistor 380, resulting in no net change of the voltage level on the AGC filter capacitor. These matched source and sink currents will be of the same magnitude, regardless of the level of the voltage on the AGC filter capacitor 24.

When the latching circuit 70 is not keying AGC circuit 20 into operation between keying intervals, transistor 320 will attempt to charge capacitor 330 to the maximum amplitude of the video signal. Peak detector capacitor 330 will not retain an appreciable charge at this time, however, because diode 340 remains forward biased when transistor 350 is not conducting and continually discharges capacitor 330 to ground through resistors 342, 344 and 346. This discharge path prevents the retention of the peak amplitude of the video signal and impulse noise pulses on capacitor 330 during video trace intervals, which would cause AGC circuit 20 to falsely set up in response to the signal or noise pulse peaks during the succeeding keying interval. The discharge path thus obviates the need for complex noise protection circuits in AGC circuit 20.

Current source transistor 360 and current sink transistor 380 present a high output impedance to the AGC filter capacitor 24 between keying intervals. This is because transistors 360 and 380 are not conducting during this time and are coupled to AGC filter capacitor 24 at their high impedance collector electrodes. The high impedance at terminal 22 thus prevents undesirable changes in the AGC control voltage due to current leakage between keying intervals. The use of current source and sink transistors in the present invention obviates the need for low impedance charging and discharging means for AGC filter capacitor 24, such as resistors coupled from terminal 22 to the +B supply or ground. Such low impedance charging and discharging means are a common cause of undesirable changes in the AGC control voltage in the prior art.

When the latching circuit 70 receives a horizonta¹ retrace pulse which is not in coincidence with a sync pulse, no keying pulse is generated on conductor 264 and a small positive pulse is generated on conductor 266. This small positive pulse is coupled to the base of transistor 380 by resistor 374, causing that transistor to conduct slightly. The slight conduction of current sink transistor 380 results in a slight discharge of AGC filter capacitor 24 toward ground and a small increase in gain in the RF and IF circuits of the television receiver. Since this out-of-sync condition usually results from the reception of a weak video signal, the slight increase in gain enables the sync separator 40 and the latching circuit 70 to quickly reacquire synchronization. The slight conduction by transistor 380 also offsets any small flow of undesired charging current into the filter capacitor 24 from the AGC transfer circuit 400. This operation of the AGC circuit 20 in response to the pulse on conductor 266 is described in further detail in my copending United States patent application, Ser. No. 934,822, entitled, "SYNCHRONIZATION AND GAIN CONTROL CIRCUIT," filed concurrently herewith.

What is claimed is:

1. In an automatic gain control circuit of the type which is responsive to the level of synchronizing signal components of a composite video signal for developing an automatic gain control voltage, including means for supplying a composite video signal having synchronizing signal components, and a source of recurrent pulses normally in time coincidence with said synchronizing signal components; an automatic gain control voltage generator comprising:

a peak detector having an input circuit responsive to said composite video signal and an output circuit including a peak detecting capacitor which is charged to the peak amplitude of said synchronizing signal components;

a filter capacitor;

signal translating means responsive to said recurrent pulses for adjusting the voltage across said filter capacitor to a level determined by the charge condition of said peak detecting capacitor;

means, independent of said filter capacitor and coupled to said peak detector, for discharging said peak detecting capacitor; and means responsive to said recurrent pulses for disabling said discharging means.

2. The automatic gain control circuit of claim 1, wherein:

said signal translating means comprises a first signal path responsive to said recurrent pulses and the charge condition of said peak detecting capacitor for generating a charging signal and a first transistor having a high impedance output electrode coupled to said filter capacitor and responsive to said charging signal for charging said filter capacitor; and a second signal path responsive to said recurrent pulses and the charge condition of said peak detecting capacitor for generating a discharging signal and a second transistor having a high impedance output electrode coupled to said filter capacitor and responsive to said discharging signal for discharging said filter capacitor.

3. In an automatic gain control circuit of the type which is responsive to the level of synchronizing signal components of a composite video signal for developing an automatic gain control voltage, including means for supplying a composite video signal having synchronizing signal components, and a source of recurrent pulses normally in time coincidence with said synchronizing signal components; an automatic gain control voltage generator comprising:

a peak detector having an input circuit responsive to said composite video signal and an output circuit including a peak detecting capacitor which is charged to the peak amplitude of said synchronizing signal components;

a filter capacitor;

signal translating means responsive to said recurrent pulses for adjusting the voltage across said filter capacitor to a level determined by the charge condition of said peak detecting capacitor, said signal translating means comprising first and second transistors of opposite conductivity types having base, emitter and collector electrodes, wherein the collector electrode of said first transistor is coupled to the collector electrode of said second transistor, the emitter electrodes of said first and second transistors are coupled to two terminals of a power supply, and said filter capacitor is coupled between the junction of said collector electrodes and one of said power supply terminals;

means, independent of said filter capacitor and coupled to said peak detector, for discharging said peak detecting capacitor; and means responsive to said recurrent pulses for disabling said discharging means;

wherein said base electrodes of said first and second transistors are each responsive to said recurrent pulses and the charge condition of said peak detecting capacitor for adjusting the voltage across said filter capacitor.

4. In an automatic gain control circuit of the type which is responsive to the level of synchronizing signal components of a composite video signal for developing an automatic gain control voltage, including means for supplying a composite video signal having synchronizing signal components, and a source of recurrent pulses normally in time coincidence with said synchronizing signal components; an automatic gain control voltage generator comprising:

a peak detector having an input circuit responsive to said composite video signal and an output circuit including a peak detecting capacitor which is charged to the peak amplitude of said synchronizing signal components;

a filter capacitor;

signal translating means responsive to said recurrent pulses for adjusting the voltage across said filter capacitor to a level determined by the charge condition of said peak detecting capacitor;

the series combination of a diode and a resistor coupled across said peak detecting capacitor for discharging said peak detecting capacitor; and means responsive to said recurrent pulses for disabling said discharging means, wherein said diode is reverse biased by said disabling means in response to said recurrent pulses.

5. In an automatic gain control circuit of the type which is responsive to the level of synchronizing signal components of a composite video signal for developing an automatic gain control voltage, including means for supplying a composite video signal having synchronizing signal components, and a source of recurrent pulses normally in time coincidence with said synchronizing signal components, an automatic gain control voltage generator comprising:

a filter capacitor; and signal translating means comprising a first signal path having an input responsive to said recurrent pulses and said composite video signal and an output electrode coupled to said filter capacitor for providing charging current to said filter capacitor, and a second signal path having an input responsive to said recurrent pulses and said composite video signal and an output electrode coupled to said filter capacitor for conducting discharging current from said filter capacitor, wherein the net charge on said filter capacitor develops an automatic gain control voltage which is related to the level of the synchronizing signal components of the composite video signal and wherein said charging and discharging currents are independent of the voltage at said output electrodes.

6. In an automatic gain control circuit of the type which is responsive to the level of synchronizing signal components of a composite video signal for developing an automatic gain control voltage, including means for supplying a composite video signal having synchronizing signal components, and a source of recurrent pulses normally in time coincidence with said synchronizing signal components, an automatic gain control voltage generator comprising:

a filter capacitor;

a first controlled current path having an input responsive to said recurrent pulses and said composite video signal and an output electrode coupled to said filter capacitor for providing charging current to said filter capacitor; and a second controlled current path having an input responsive to said recurrent pulses and said composite video signal and an output electrode coupled to said filter capacitor for conducting discharging current from said filter capacitor;

wherein the net charge on said filter capacitor develops an automatic gain control voltage which is related to the level of the synchronizing signal components of the composite video signal and wherein said charging and discharging currents are independent of the voltage at said output electrodes.

7. In an automatic gain control circuit of the type which is responsive to the level of synchronizing signal components of a composite video signal for developing an automatic gain control voltage, including means for supplying a composite video signal having synchronizing signal components, and a source of recurrent pulses normally in time coincidence with said synchronizing signal components, an automatic gain control voltage generator comprising:

a filter capacitor;

a first controlled current path responsive to said recurrent pulses and said composite video signal for charging said filter capacitor; and a second controlled current path responsive to said recurrent pulses and said composite video signal for discharging said filter capacitor;

wherein the net charge on said filter capacitor develops an automatic gain control voltage which is related to the level of the synchronizing signal components of the composite video signal, and said first controlled current path comprises a first transistor of one conductivity type having a base electrode which is responsive to said recurrent pulses and said composite video signal, an emitter electrode coupled to a first terminal of a power supply, and a collector electrode;

said second controlled current path comprises a second transistor of opposite type conductivity having a base electrode which is responsive to said recurrent pulses and said composite video signal, an emitter electrode coupled to a second terminal of said power supply and a collector electrode coupled to the collector electrode of said first transistor; and said filter capacitor is coupled between the junction of said collector electrodes of said first and second transistors and one of said power supply terminals.

8. The automatic gain control circuit of claim 3 or 7, wherein:

the current conducted by said first transistor during the occurrence of a recurrent pulse is equal to the current conducted by said second transistor when said synchronizing signal components are at the desired signal level.

9. The automatic gain control circuit of claim 8, wherein:

the equal currents conducted by said first and second transistors when said synchronizing signal components are at the desired signal level are of a constant magnitude, independent of the level of the automatic gain control voltage stored across said filter capacitor.

10. In an automatic gain control circuit of the type which is responsive to the level of synchronizing signal components of a composite video signal for developing an automatic gain control voltage, including means for supplying a composite video signal having synchronizing signal components, and a source of recurrent pulses normally in time coincidence with said synchronizing signal components; an automatic gain control voltage generator comprising:

a peak detector having an input circuit responsive to said composite video signal and an output circuit including a peak detecting capacitor which is charged to the peak amplitude of said synchronizing signal components;

a filter capacitor;

signal translating means responsive to said recurrent pulses for adjusting the voltage across said filter capacitor to a level determined by the charge condition of said peak detecting capacitor;

means, independent of said filter capacitor and coupled to said peak detector, for discharging said peak detecting capacitor;

means responsive to said recurrent pulses for disabling said discharging means, wherein said signal translating means comprises a first signal path responsive to said recurrent pulses and the charge condition of said peak detecting capacitor for generating a charging signal and a first transistor having a high impedance output electrode coupled to said filter capacitor and responsive to said charging signal for charging said filter capacitor, and a second signal path responsive to said recurrent pulses and the charge condition of said peak detecting capacitor for generating a discharging signal and a second transistor having a high impedance output electrode coupled to said filter capacitor and responsive to said discharging signal for discharging said filter capacitor, and the current conducted by said first transistor during the occurrence of a recurrent pulse is equal to the current conducted by said second transistor when said synchronizing signal components are at the desired signal level.

11. The automatic gain control circuit of claim 10, wherein:

the equal currents conducted by said first and second transistors when said synchronizing signal components are at the desired signal level are of a constant magnitude, independent of the level of the automatic gain control voltage stored across said filter capacitor.

* * * * *